(12) United States Patent
Zach

(10) Patent No.: US 7,124,396 B2
(45) Date of Patent: Oct. 17, 2006

(54) ALTERNATING PHASE-SHIFT MASK RULE COMPLIANT IC DESIGN

(75) Inventor: Franz X. Zach, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 329 days.

(21) Appl. No.: 10/708,684

(22) Filed: Mar. 18, 2004

(65) Prior Publication Data

US 2005/0210436 A1    Sep. 22, 2005

(51) Int. Cl.
*G06F 17/50* (2006.01)

(52) U.S. Cl. .............................. 716/21; 716/19; 716/20

(58) Field of Classification Search ............. 716/19–21
See application file for complete search history.

(56) References Cited

U.S. PATENT DOCUMENTS

| | | | |
|---|---|---|---|
| 5,537,648 A * | 7/1996 | Liebmann et al. ............. | 716/19 |
| 5,883,813 A * | 3/1999 | Kim et al. ...................... | 716/19 |
| 6,057,063 A | 5/2000 | Liebmann et al. | |
| 6,197,456 B1 | 3/2001 | Aleshin et al. | |
| 6,338,922 B1 | 1/2002 | Liebmann et al. | |
| 6,523,165 B1 * | 2/2003 | Liu et al. ....................... | 716/21 |
| 6,543,045 B1 * | 4/2003 | Ludwig et al. ................ | 716/21 |
| 6,584,610 B1 * | 6/2003 | Wu et al. ....................... | 716/19 |
| 6,605,481 B1 | 8/2003 | Wu et al. | |
| 6,609,245 B1 | 8/2003 | Liebmann et al. | |
| 6,622,288 B1 | 9/2003 | Wang et al. | |
| 6,681,379 B1 * | 1/2004 | Pierrat et al. .................. | 716/19 |
| 7,028,285 B1 * | 4/2006 | Cote et al. ..................... | 716/21 |
| 2002/0012851 A1 | 1/2002 | Coronel et al. | |
| 2002/0197546 A1 | 12/2002 | Pierrat | |
| 2003/0008222 A1 | 1/2003 | Pierrat | |
| 2003/0013024 A1 | 1/2003 | Pierrat | |
| 2003/0014732 A1 | 1/2003 | Liu et al. | |
| 2003/0056190 A1 | 3/2003 | Liu et al. | |
| 2003/0093766 A1 | 5/2003 | Liebmann et al. | |

* cited by examiner

*Primary Examiner*—Vuthe Siek
*Assistant Examiner*—Naum Levin
(74) *Attorney, Agent, or Firm*—Todd M. C. Li; Hoffman, Warnick & D'Alessandro LLC

(57) ABSTRACT

A system, method and program product that implement a design object that automatically provides compliance to alternating phase shifted mask (altPSM) rules are disclosed. The invention implements a design object that is used during layout to indicate a phase-shiftable design feature in the layout. Each design object includes a base shape indicative of the feature to be ultimately created and two different type phase shape identifiers that identify the requisite mask area and color of phase-shift required for that base shape. Each phase shape identifier is assigned to a portion of the base shape. During layout, overlapping placement of design objects is not allowed if the placement requires overlapping phase identifiers of the same type. Alternatively, placement is allowed where the phase identifiers of different type are separated by a minimum distance from each other defined by a buffer of the design object.

20 Claims, 5 Drawing Sheets

ALTERNATING PHASE-SHIFT MASK RULE COMPLIANT IC DESIGN

BACKGROUND OF INVENTION

The present invention relates generally to very large scale integrated (VLSI) circuit devices. In particular, the present invention provides a method, system, program product that implement a design object that automatically provides compliance with alternating phase shifted mask (altPSM) rules.

Alternating phase shift masks (altPSM) have found increased usage in lithography for semiconductor manufacture and elsewhere because they allow creation of smaller dimension features. Extensive use of altPSM with complex chip designs, however, has been limited by the complexity of the designs and the need to maintain compliance with altPSM design rules. One problem that arises during design layout using computer aided (CAD) technology is that phase shape regions of the same phase (referred to as "color") may be laid out such that they overlap, e.g., overlapping of phase shape regions in the mask for adjacent lines. Since the phase shape regions have the same color, they conflict such that the improper optical interference occurs during generation of the desired feature. Accordingly, altPSM design rules mandate that conflicts between phase shape regions be avoided. As designs become more complex and features are laid out in an increasingly dense fashion, the likelihood that this type problem occurs is greatly increased.

One approach to address this layout problem has been to implement groundrules to avoid violation of altPSM design rules. This approach, however, leads to a number of other problems such as: performance optimization opportunities being unused, increased device size, etc.

Another approach to address the problem has been to implement phase-aware design methodologies that implement altPSM design rules, e.g., to avoid phase conflicts. In phase-aware design methodologies, the phase shape regions are added or identified in a design after layout using special programs that add/identify phase-shiftable features and address phase conflicts and other phase related design problems. See, for example, U.S. Pat. No. 6,057,063 to Liebmann et al. This approach, however, results in lengthy correction procedures. For example, referring to FIGS. 1 and 2, a conventional methodology for phase-aware design and application of the methodology to an illustrative shape are shown, respectively. In step (a), a layout 10 is designed, and repetitive design rule checking (DRC) is conducted to obtain a DRC-clean layout 12. In step (b), a phase-shiftable feature 14 is added/identified using custom programs. In step (c), the layout is analyzed to determine whether the layout is altPSM design rule compliant, e.g., whether one or more phase conflicts or other phase related problems 16 exist. In step (d), the layout is modified to achieve compliance if it is non-compliant, which may require return to step (c) and/or step (a). This process is repeated with each modification until the layout is ultimately altPSM design rule compliant. Since each modification requires re-analysis, this approach is both time consuming and processor laborious.

In view of the foregoing, there is a need in the art for a technique that solves the problems of the related art.

SUMMARY OF INVENTION

The invention includes a system, method and program product that implements a design object that automatically provides compliance to alternating phase shifted mask (altPSM) rules. The invention implements a design object that is used during layout to indicate a phase-shiftable design feature in the layout including phase-shift related structure. In particular, each design object includes a base shape indicative of the feature to be ultimately created and two (2) different type phase shape identifiers that identify the requisite mask area and color of phase-shift required for that base shape. One phase shape identifier is assigned to a portion of the base shape. During layout, placement rules for the design object mandate that design objects may not be placed on top of each other if the placement requires overlapping phase identifiers of the same type. In addition, a design object may include a buffer. Placement rules may then require that placement of a design object is such that phase identifiers of different type have to be separated by a minimum distance from each other. Use of the design objects allows the design methodology to be simplified in that the addition or identification of phase-shiftable features using custom programs after layout (i.e., step (b) of FIGS. 1–2) is no longer necessary. As a consequence, extensive phase compliance checks and lengthy design modifications (i.e., step (d) in FIGS. 1–2) are eliminated. In addition, the invention allows efficient compaction algorithms to run, which simplifies routing for backend usage of altPSM.

A first aspect of the invention is directed to a method of designing a layout of an integrated circuit using an alternating phase shift mask, the method comprising the steps of: providing at least two design objects for designing a phase-shiftable feature in the layout, each design object including: a base shape, a first phase shape identifier assigned to a first portion of the base shape, the first phase shape identifier having a first type, and a second phase shape identifier assigned to a second portion of the base shape, the second phase shape identifier having a second different type; and allowing placement of the design object overlapping another design object during design of the layout only in the case that the types of any overlapping phase shape identifiers are compatible.

A second aspect of the invention is directed to a computer program product comprising a computer useable medium having computer readable program code embodied therein for designing an integrated circuit layout using an alternating phase shift mask, the program product comprising: program code configured to provide a plurality of selectable design objects for designing at least one phase-shiftable design feature in the layout, each design object including: a base shape, a first phase shape identifier assigned to a first portion of the base shape, the first phase shape identifier having a first type, and a second phase shape identifier assigned to a second portion of the base shape, the second phase shape identifier having a second type; and program code configured to allow placement of the design object overlapping another design object during design of the layout only in the case that the types of any overlapping phase shape identifiers are compatible.

A third aspect of the invention is directed to an integrated circuit design system comprising: means for providing a plurality of selectable design objects for designing at least one phase-shiftable design feature in the layout, each design object including: a base shape, a first phase shape identifier assigned to a first portion of the base shape, the first phase shape identifier having a first type, and a second phase shape identifier assigned to a second portion of the base shape, the second phase shape identifier having a second type; and means for allowing placement of the design object overlapping another design object during design of the layout only in the case that the types of any overlapping phase shape identifiers are compatible.

The foregoing and other features of the invention will be apparent from the following more particular description of embodiments of the invention.

BRIEF DESCRIPTION OF DRAWINGS

The embodiments of this invention will be described in detail, with reference to the following figures, wherein like designations denote like elements, and wherein.

DETAILED DESCRIPTION

Figure 3:
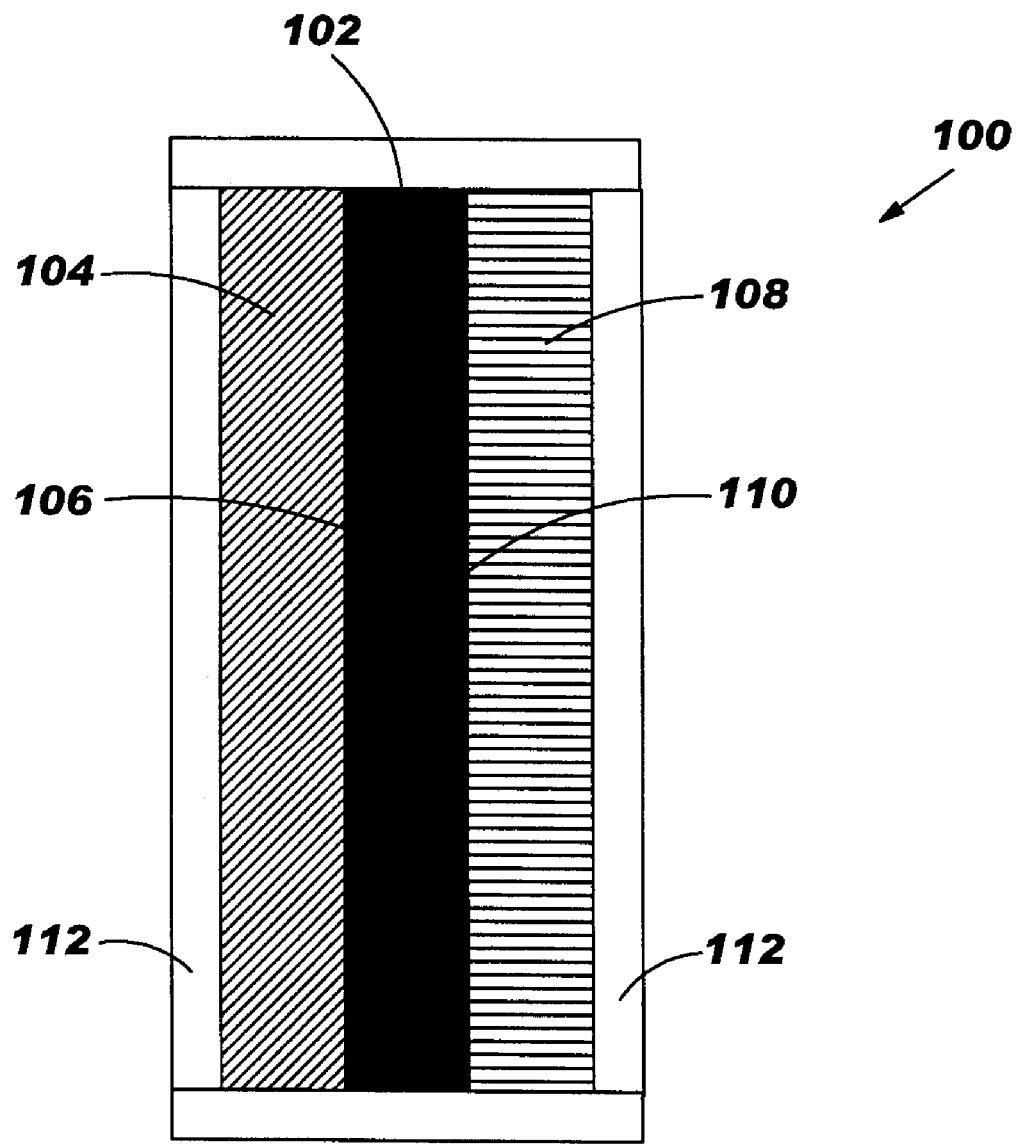
FIG. 3 shows a design object according to the invention.

Referring to FIG. 3, a design object 100 for use in designing an integrated circuit using an alternating phase shift mask (not shown) according to the invention is illustrated. Design object 100 includes a base shape 102, a first phase shape identifier 104 assigned to a first portion 106 of base shape 102, and a second phase shape identifier 108 assigned to a second portion 110 of base shape 102. Base shape 102 is indicative of the feature to be ultimately created for the device, i.e., it is the desired phase-shiftable feature. As used herein "phase-shiftable feature" indicates a design feature that is to be generated using an alternating phase shift mask (altPSM), while "non-phase-shiftable feature" indicates any standard design feature that does not require an alt PSM to generate.

Each phase shape identifier 104, 108 indicates a requisite phase-shift region for the mask area and a color of that phase-shift region required to generate base shape 102. Accordingly, phase shape identifiers 104, 108 communicate to a designer of a layout what the requisite mask area and color of phase-shift is used to generate base shape 102. In order to prevent violation of an altPSM design rule, each phase shape identifier 104, 108 has a type that is indicative of its phase-shift color. The type may be communicated to a designer in any of a variety of fashions, e.g., color (e.g., blue, green, yellow), shading (e.g., cross-hatching type), etc. Since each base shape 102 requires two phase-shift regions of different color, a first phase shape identifier has a first type, and a second phase shape identifier has a second different type.

As also shown in FIG. 3, each design object may also include a buffer 112. Each buffer 112 indicates a standoff distance required for placement of one design object adjacent to another design object where the adjacent portions have phase shape identifiers of the same type. That is, buffer 112 is configured to allow placement of a design object adjacent another design object during design of the layout where adjacent phase shape identifiers of the respective design objects have different types only in the case that the design objects are distanced from one another by a distance greater than buffer 112. As a result, phase conflicts between adjacent design objects are avoided.

Figure 4:
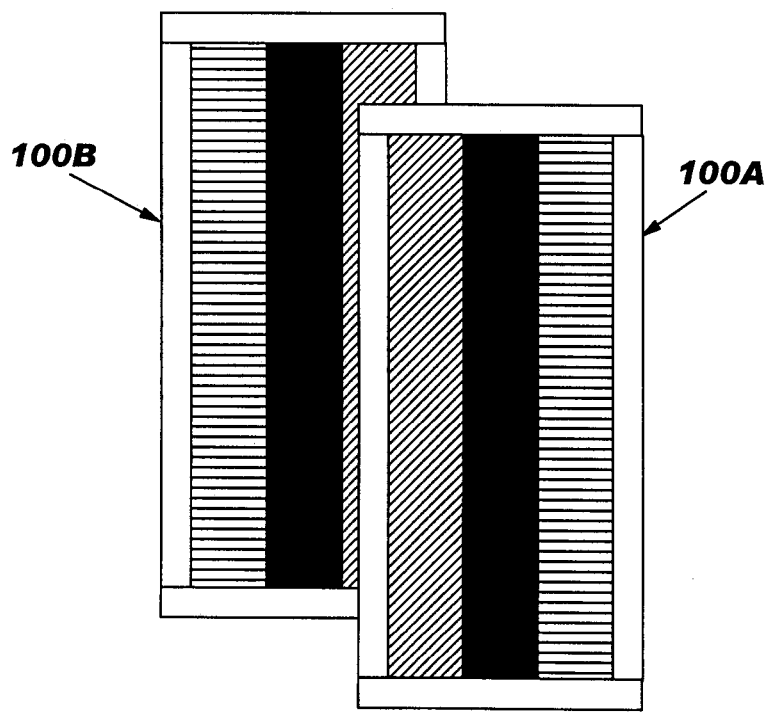
FIGS. 4–6 shows implementation of the design object of FIG. 3 according to a method of the invention.
Figure 5:
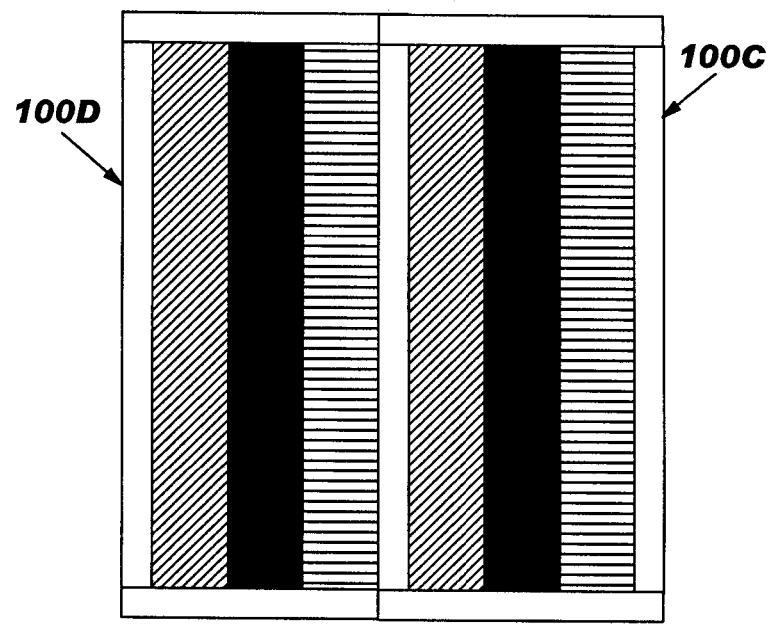
Figure 6:
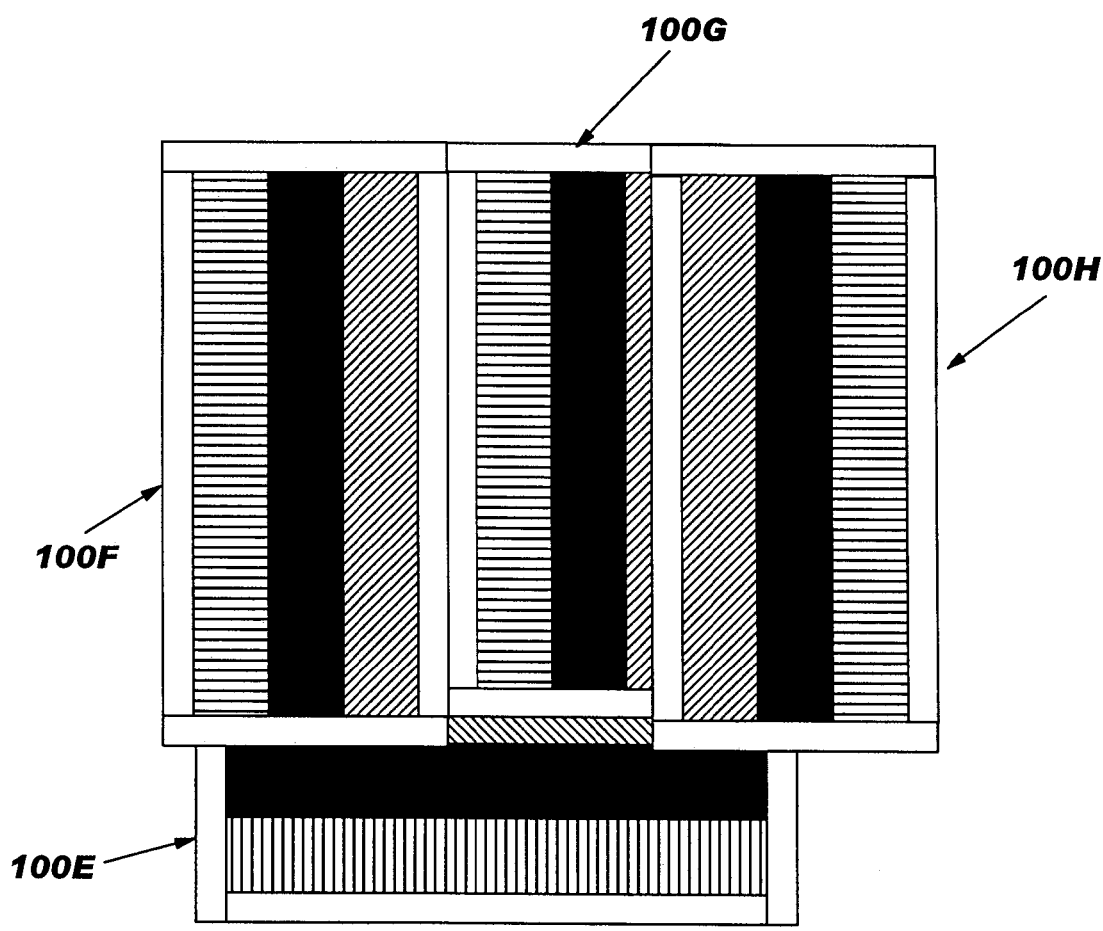

Referring to FIG. 4–6, a method according to the invention will be described relative to an illustrative design feature to be generated by two design objects in an integrated circuit computer aided design (CAD) system. In particular, as shown in FIG. 4, a plurality of design objects (at least two) are provided for designing a phase-shift design feature. Placement of a design object 100A overlapping another design object 100B during design of a layout is allowed only in the case that the types of any overlapping phase shape identifiers are compatible. As used herein "compatible" means that the placement will not violate a PSM design rule, e.g., that no phase conflicts are allowed. The indication of compatability may be made by how the type is communicated. That is, the types are the same or have a common characteristic. In one embodiment, where a color such as blue is used to indicate a phase shift type (color), only the particular color (i.e., blue), or different shades of that color (e.g., light and dark blue), may be allowed to overlap. In another embodiment, where a shading such as horizontal lines is used to indicate a phase shift type (color), only the particular shading, or different thicknesses of lines for that shading, may be allowed to overlap.

Figure 1:
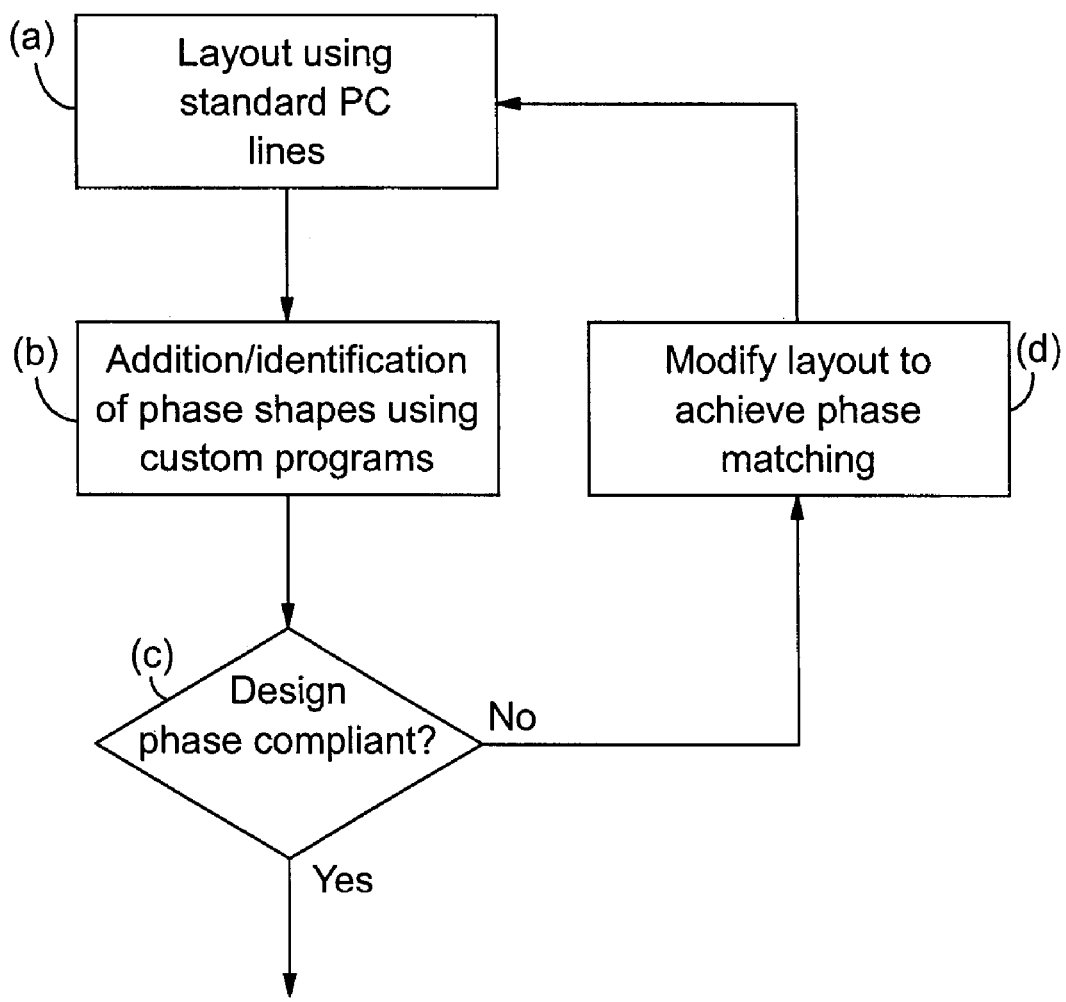
FIG. 1 shows a conventional technique for implementing a phase-shiftable design feature in a design layout.
Figure 2:
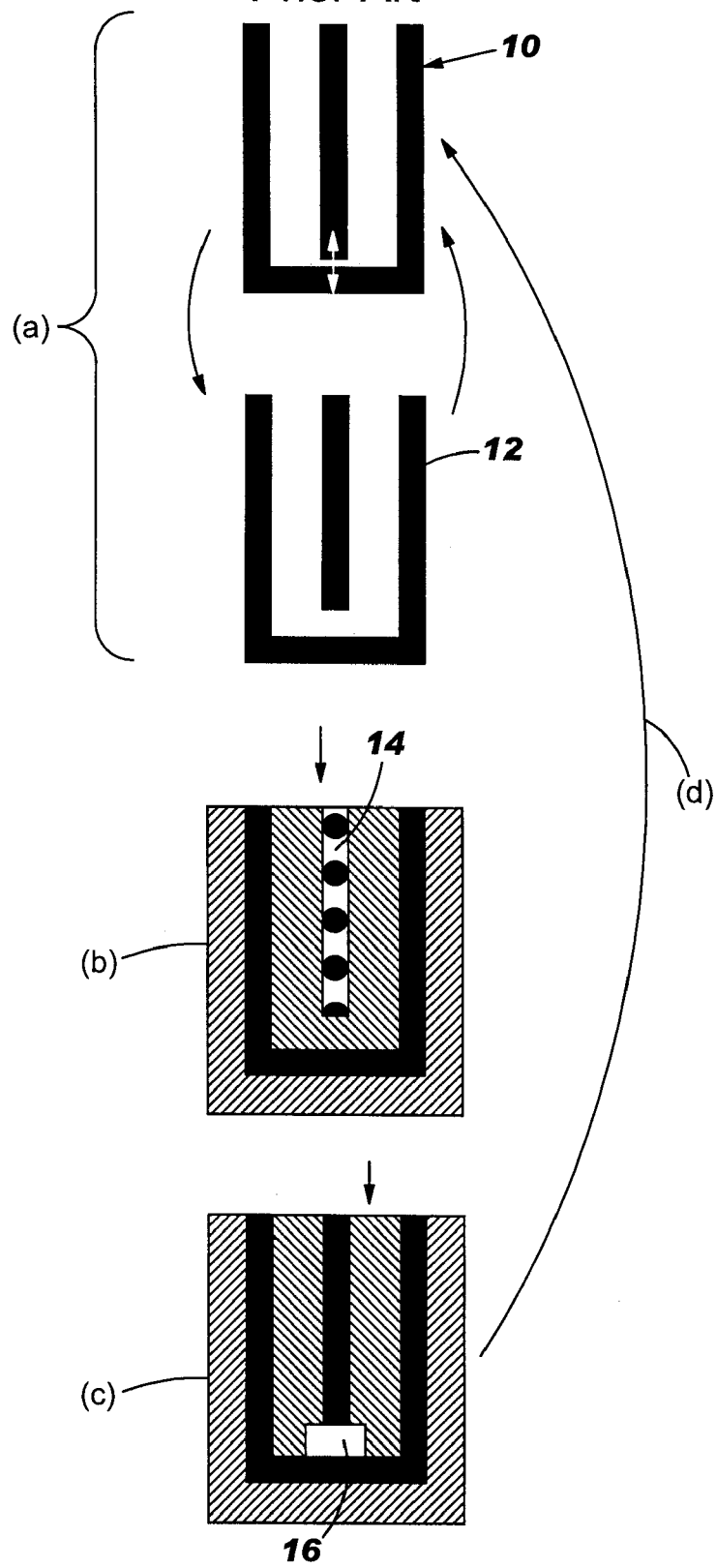
FIG. 2 shows stepwise processing of an illustrative layout according to the conventional technique of FIG. 1.

In contrast, as shown in FIG. 5, placement of a design object 100C overlapping another design object 100D during design of a layout is not allowed in the case that the types of any overlapping phase shape identifiers are incompatible. However, placement of design object 100C adjacent another design object 100D where adjacent phase shape identifiers have different types would be allowed only in the case that the design objects 100C, 100D are distanced from one another by a distance greater than the buffer 112. The method of the invention may also include providing a design shape (not shown) for designing a non-phase-shiftable feature, e.g., one having a size above a cutoff at which phase shifting is required, in the layout in a conventional fashion. These design shapes do not include phase shift indicators or a buffer. FIG. 6 illustrates implementation of four design objects 100E-H to generate the layout of prior art FIG. 2.

It should be understood that while design object 100 has been illustrated as a line in which each portion 106, 110 is a side of the line, design object 100 can be any shape of design feature to be used in an IC design and capable of generation using current or later developed phase-shift mask technology. Accordingly, the invention should not be limited to any particular shape of design object. In addition, each portion 106, 110 of a base shape 102 having assigned thereto a phase shape identifier may vary according to the shape of base shape 102 to, for example, accommodate specific PSM design rules.

It will be understood that the method steps discussed are performed by a data processor system executing instructions of a program product stored in memory. It is understood that the methods described herein may be realized in hardware, software, or a combination of hardware and software, and may be compartmentalized other than as shown. They may be implemented by any type of computer system or other apparatus adapted for carrying out the methods described herein. A typical combination of hardware and software could be a general-purpose computer system with a computer program that, when loaded and executed, controls the computer system such that it carries out the methods described herein. Alternatively, a specific use computer, containing specialized hardware for carrying out one or more of the functional tasks of the invention could be utilized. The present invention can also be embedded in a computer program product, which comprises all the features enabling the implementation of the methods and functions described herein, and which—when loaded in a computer system—is able to carry out these methods and functions. Computer program, software program, program, program product, or software, in the present context mean any expression, in any language, code or notation, of a set of instructions intended to cause a system having an information processing capability to perform a particular function either directly or after the following: (a) conversion to another language, code or notation; and/or (b) reproduction in a different material form.

While this invention has been described in conjunction with the specific embodiments outlined above, it is evident that many alternatives, modifications and variations will be apparent to those skilled in the art. Accordingly, the embodiments of the invention as set forth above are intended to be illustrative, not limiting. Various changes may be made without departing from the spirit and scope of the invention as defined in the following claims.

The invention claimed is:

1. A method of designing a layout of an integrated circuit using an alternating phase shift mask, the method comprising the steps of:
   providing at least two design objects for designing a phase-shiftable feature in the layout, each design object including:
      a base shape,
      a first phase shape identifier assigned to a first portion of the base shape, the first phase shape identifier having a first type, and
      a second phase shape identifier assigned to a second portion of the base shape, the second phase shape identifier having a second different type; and
   allowing placement of the design object overlapping another design object during design of the layout only in the case that the types of any overlapping phase shape identifiers are compatible.

2. The method of claim 1, wherein each design object further includes a buffer, the method further comprising the step of:
   allowing placement of a design object adjacent another design object during design of the layout where adjacent phase shape identifiers have different types only in the case that the design objects are distanced from one another by a distance greater than the buffer.

3. The method of claim 1, wherein each portion is a side of a respective base shape.

4. The method of claim 1, wherein the base shape includes a line.

5. The method of claim 1, wherein each phase shape identifier indicates a requisite mask area.

6. The method of claim 1, wherein each phase shape identifier indicates a color of phase-shift required for the base shape.

7. The method of claim 1, further comprising the step of providing a design shape for designing a non-phase-shiftable feature in the layout.

8. A computer program product comprising a computer usable medium having computer readable program code embodied therein for designing an integrated circuit layout using an alternating phase shift mask, the program product comprising:
   program code configured to provide a plurality of selectable design objects for designing at least one phase-shiftable design feature in the layout, each design object including:
      a base shape,
      a first phase shape identifier assigned to a first portion of the base shape, the first phase shape identifier having a first type, and
      a second phase shape identifier assigned to a second portion of the base shape, the second phase shape identifier having a second type; and
   program code configured to allow placement of the design object overlapping another design object during design of the layout only in the case that the types of any overlapping phase shape identifiers are compatible.

9. The program product of claim 8, wherein each design object further includes a buffer, the program product further comprising the step of:
   program code configured to allow placement of a design object adjacent another design object during design of the layout where adjacent phase shape identifiers have different types only in the case that the design objects are distanced from one another by a distance greater than the buffer.

10. The program product of claim 8, wherein each portion is a side of a respective base shape.

11. The program product of claim 8, wherein the base shape includes a line.

12. The program product of claim 11, wherein each portion is a side of the line.

13. The program product of claim 8, farther comprising program code configured to provide a plurality of design shapes for designing at least one lithographic shape in the layout.

14. An integrated circuit design system comprising:
   means for providing a plurality of selectable design objects for designing at least one phase-shiftable design feature in the layout, each design object including:
      a base shape,
      a first phase shape identifier assigned to a first portion of the base shape, the first phase shape identifier having a first type, and
      a second phase shape identifier assigned to a second portion of the base shape, the second phase shape identifier having a second type; and
   means for allowing placement of the design object overlapping another design object during design of the layout only in the case that the types of any overlapping phase shape identifiers we compatible.

15. The design system of claim 14, wherein each design object further includes a buffer, the design system further comprising: means for allowing placement of a design object adjacent another design object during design of the layout where adjacent phase shape identifiers have different types only in the case that the design objects are distanced from one another by a distance greater than the buffer.

16. The design system of claim 14, wherein each portion is a side of a respective base shape.

17. The design system of claim 14, wherein the base shape includes a line.

18. The design system of claim 14, wherein each phase shape identifier indicates a requisite mask area.

19. The design system of claim 14, wherein each phase shape identifier indicates a color of phase-shift required for the base shape.

20. The design system of claim 14, further comprising means for providing a design shape for designing a non-phase-shiftable feature in the layout.

* * * * *